US006887773B2

(12) United States Patent
Gunn, III et al.

(10) Patent No.: US 6,887,773 B2
(45) Date of Patent: May 3, 2005

(54) METHODS OF INCORPORATING GERMANIUM WITHIN CMOS PROCESS

(75) Inventors: Lawrence C. Gunn, III, Altadena, CA (US); Giovanni Capellini, Los Angeles, CA (US); Maxime Jean Rattier, Pasadena, CA (US); Thierry J. Pinguet, Pasadena, CA (US)

(73) Assignee: Luxtera, Inc., Carlsbad, CA (US)

( * ) Notice: Subject to any disclaimer, the term of this patent is extended or adjusted under 35 U.S.C. 154(b) by 104 days.

(21) Appl. No.: 10/458,165

(22) Filed: Jun. 10, 2003

(65) Prior Publication Data

US 2004/0092104 A1 May 13, 2004

Related U.S. Application Data

(60) Provisional application No. 60/433,470, filed on Dec. 13, 2002, provisional application No. 60/432,946, filed on Dec. 12, 2002, provisional application No. 60/432,925, filed on Dec. 12, 2002, provisional application No. 60/393,484, filed on Jul. 3, 2002, provisional application No. 60/391,277, filed on Jun. 24, 2002, and provisional application No. 60/389,962, filed on Jun. 19, 2002.

(51) Int. Cl.$^7$ ............................................. H01L 21/20
(52) U.S. Cl. ...................... 438/481; 438/958
(58) Field of Search ................................ 438/478, 481, 438/505, 508, 958

(56) References Cited

U.S. PATENT DOCUMENTS

| 5,861,059 | A | * | 1/1999 | Suzuki ........................ 117/97 |
| 6,171,973 | B1 | * | 1/2001 | Schiavone et al. .......... 438/719 |
| 6,271,144 | B1 | * | 8/2001 | Monget et al. ............. 438/706 |
| 6,537,894 | B2 | * | 3/2003 | Skotnicki et al. ........... 438/424 |

* cited by examiner

*Primary Examiner*—Chandra Chaudhari
(74) *Attorney, Agent, or Firm*—Fernandez & Associates LLP

(57) ABSTRACT

Methods for deposition of a Ge layer during a CMOS process on a monolithic device are disclosed. The insertion of the Ge layer enables the conversion of light to electrical signals easily. As a result of this method, standard metals can be attached directly to the Ge in completing an electrical circuit. Vias can also be used to connect to the Ge layer. In a first aspect of the invention, a method comprises the step of incorporating the deposition of Ge at multiple temperatures in a standard CMOS process. In a second aspect of the invention, a method comprises the step of incorporating the deposition of poly-Ge growth in a standard CMOS process.

173 Claims, 2 Drawing Sheets

METHODS OF INCORPORATING GERMANIUM WITHIN CMOS PROCESS

This application claims priority from U.S. Provisional Application Ser. No. 60/389,962, filed on Jun. 19, 2002, U.S. Provisional Application Ser. No. 60/391,277, filed on Jun. 24, 2002, U.S. Provisional Application Ser. No. 60/393,484, filed on Jul. 3, 2002, U.S. Provisional Application Ser. No. 60/432,946, filed on Dec. 12, 2002, U.S. Provisional Application Ser. No. 60/432,925, filed on Dec. 12, 2002, and U.S. Provisional Application Ser. No. 60/433,470, filed on Dec. 13, 2002.

BACKGROUND INFORMATION

1. Field of the Invention

The invention relates generally to the field of chip manufacturing process, and is more particularly to fabrication with one or more germanium layers.

2. Description of Related Art

The convergence of silicon and optical fabrication processes presents an attractive manufacturing solution by leveraging the use of a standard CMOS (complementary metal-oxide semiconductor) manufacturing process. Some optical companies have selected III–V semiconductors to provide high detection efficiency, but this selection poses difficult challenges in incorporating a III–V material in a standard CMOS technology. For additional background information on SiGe structures, the reader is referred to "Metal-semiconductor-metal near-infrared light detector based on epitaxial Ge/Si", by L. Colace et al. and G. Capellini et al., Applied Physics Letters, Vol. 72, No. 24, pp. 3175–3177.

Accordingly, it is desirable to incorporate optical telecommunication systems within a standard CMOS process.

SUMMARY OF THE INVENTION

The invention discloses processes for deposition of one or more Germanium (Ge) layers during a standard CMOS process on a monolithic device. The insertion of one or more Ge layers enables light to be easily converted into electrical signals. Standard metals can be attached directly to the Ge in completing an electrical circuit. Vias can also be used to connect to a Ge layer.

In a first aspect of the invention, a method is described for incorporating the deposition of Ge at multiple temperatures in a standard CMOS process. A silicon oxynitride (SON) layer is used as a mask for selective Ge growth on the Si area left uncovered by the SON patterning. A thin Ge layer is then deposited from a germane Chemical-Vapor Deposition (CVD) carried out at a temperature below, for example, a temperature of 370° C. can be used if the reacting gas contains germane. Below this temperature, the Hydrogen (H) contained in the process gas may saturate the dangling bonds of the growing surface, thereby modifying the surface energy. The surfactant is action of the Hydrogen hinders the islanding phenomenon (Stranski-Krastanov growth) in the Germanium/Silicon (Ge/Si) heterostructure. It also relaxes the strain forcing the misfit dislocation insertion at the heterojunction, thus providing a seed for the nucleation of a strain-relaxed Ge film. The growth of this layer wick occurs only on the opening in the SON mask because the germane-deposition catalysis on the SON surface is not effective. After the strain is relaxed in the Ge film, a thicker Ge layer is deposited at a higher deposition temperature (for example, greater than 600° C.) in order to have, for example a layer-by-layer growth mode. The higher temperature also allows an increase in the growth rate. In order to reduce the defect density, a post-growth annealing process may be performed. The film undergoes a thermal cycling treatment typically between about 700° C. and 900° C. The film thus obtained is mono-crystalline, epitaxial, and has a small surface roughness (about 1 nm RMS roughness expected).

In a second aspect of the invention, a method is disclosed for incorporating the deposition of poly-Ge growth into a standard CMOS process. In this aspect, a low temperature (for example, T<500° C.) poly-Ge film is deposited on a Si active area. This deposition is catalyzed by a seed layer made of either poly/amorphous-Si or amorphous-Ge. Due to the electronic surface states on the crystallite boundaries, the film is "unintentionally p-doped" typically in the $10^{18}$ cm$^{-3}$ range: the Fermi level is in fact pinned close to the top of the Ge valence band.

Advantageously, with the insertion of one or more Ge layers, the present invention provides the capability of converting an optical signal carried at a wavelength range that can be absorbed by the germanium into an electrical signal.

Other structures and methods are disclosed in the detailed description below. This summary does not purport to define the invention. The invention is defined by the claims.

DETAILED DESCRIPTION OF PREFERRED EMBODIMENTS

Figure 1:
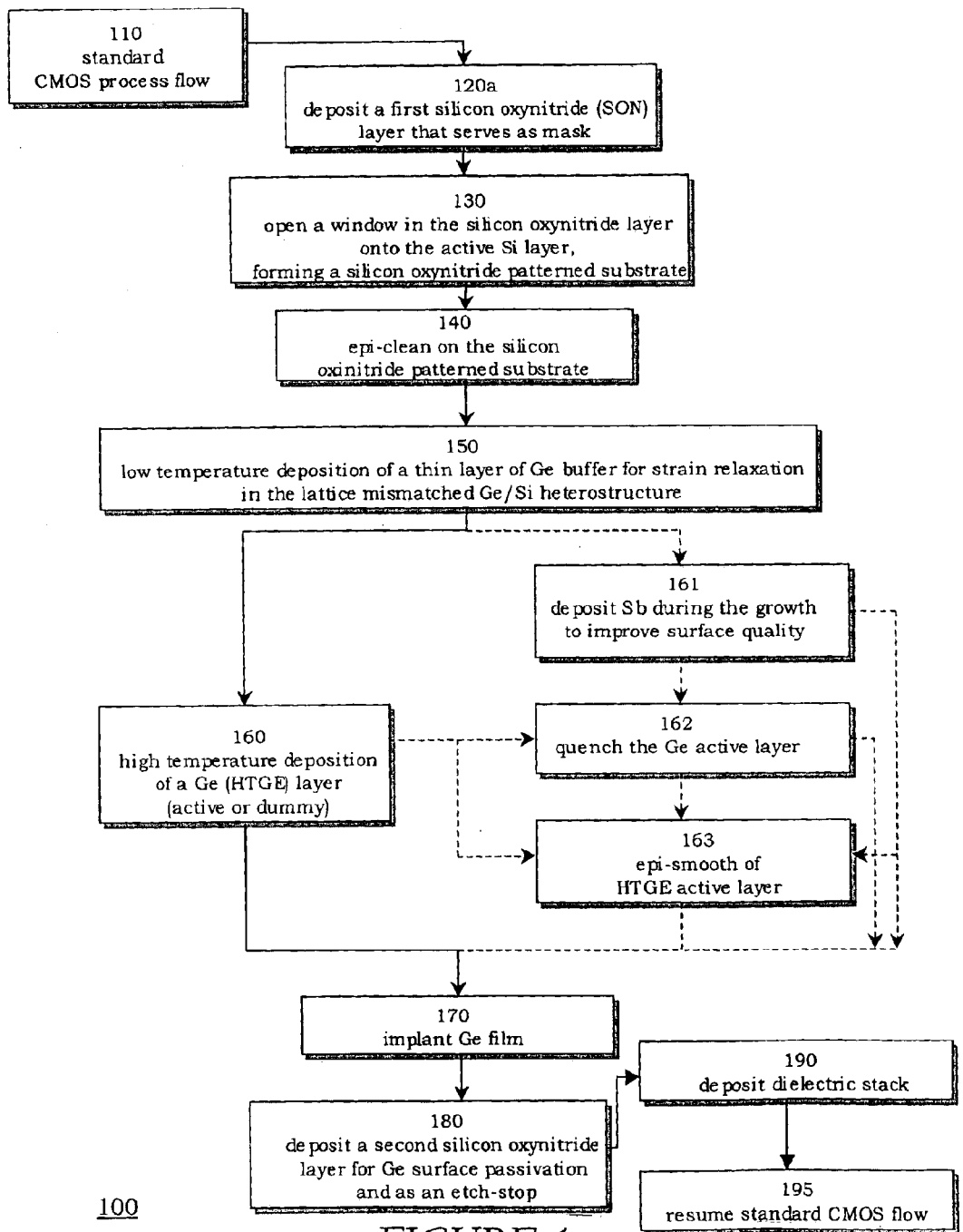
FIG. 1 depicts a flow diagram illustrating a first embodiment of the process for germanium growth on silicon in accordance with the present invention.

Referring now to FIG. 1, therein is shown a flow diagram illustrating a first embodiment of the process 100 for incorporating germanium growth in a standard CMOS process. In step 110, the manufacturing of a chip employs a standard CMOS flow with a silicon substrate. The process 100 continues until the highest temperature step, typically the salicide annealing, is performed. In step 120, the process 100 deposits a first silicon oxynitride layer. Step 120 is typically a conventional CMOS process step. One of ordinary skill in the art should recognize that the deposition of one or more silicon oxynitride layers is typical in a CMOS process. Similar or various types of compositions of silicon oxynitride can be practiced without departing from the spirit of the present invention. The first oxynitride layer is then patterned in order to expose areas of the underlying Si substrate in the process step 130. One embodiment illustrating the present invention includes depositing the silicon oxynitride layer by selecting a suitable SON film in which the oxygen and nitrogen content are both allowed to vary in the full composition range including stoichiometric SiO2 and Si3N4. The scope of the present invention extends to choosing the dielectric film with properties such that the germanium will not grow on the film. Alternatively, the dielectric film could be selected to have properties where the germanium would grow on top of the film, allowing a subsequent etch to define the shape of the deposited germanium. One of ordinary skill in the art should recognize that variations in the present material systems, as well as new material systems that carry the properties as described above, such as low-k dielectrics, can be practiced without departing from the spirit of the present invention.

The incorporation of germanium growth in a standard CMOS process in the first embodiment is intended as an example. One of ordinary skill in the art should recognize that the present invention can be extended or modified to incorporate germanium growth in BICMOS, SOI, SiGe BICMOS, SOS, and other similar manufacturing processes.

At step 130, a window is opened in the first silicon oxynitride layer exposing the active silicon (Si) layer. The shape of the opening depends on photonic and material factors. The active windows crated in step 130 have rectangular shapes with sides oriented along the <011> silicon crystallographic direction. Windows oriented in other crystalline directions could also be fabricated. The feedback on the optimal shape of the active Si layer is provided by the morphological and structural characteristics of the Ge deposited on the active Si layer.

The process 100 performs an epi-clean step 140 on the silicon oxynitride patterned substrate formed in step 130. After a layer removal of the silicon oxynitride layer, an epi-like active silicon surface is recovered. In this procedure, an ex-situ wet chemical cleaning based on hydrofluoric acid (HF) solution is followed by an in-situ annealing in dihydrogen/DCS atmosphere. The substrate temperature is approximately 700° C.

Windows in to the SON layer formed during step 120 and 130 are designed as test structures in order to perform a direct morphological inspection by means of Scanning Probe Microscopy on test wafers which have been pulled out from the process after the step 140. Pyramidal-shaped defects are expected to be formed by Si—O and Si—C surface contamination. Substrate cleanliness can be evaluated also by growing a Si buffer layer by silane CVD and evaluating the pit defect density and morphology. These defects are formed at the substrate-epilayer interface, and provides a marker of the substrate surface quality. The compatibility of the high temperature step relative to the entire fabrication process should be verified. The implanted doping distribution and the effect of the thermal stress on the existing structures are monitored.

At step 150, a thin Ge layer is deposited at a low temperature for strain relaxation in the lattice mismatched Ge/Si heterostructure. A temperature as low as 370° C. and a deposition rate of the order of 3–5 nm/min are typical values for this growth step using germane on clean silicon.

Growth dynamics is characterized and optimized in this step. An objective is to optimize the kinetics/thermodynamics of the germane chemisorption at the Si surface. The parameters that may vary include: total reaction-gas pressure, partial pressure of the Ge in the H carrier gas, substrate temperature, and amount of deposited material. The optimization feedback is provided by investigating the structural, morphological, and electrical properties of the deposited material. Other factors are also evaluated in this step including the growth rate, the incubation time, the defect density, and the stress relaxation via misfit dislocation insertion and/or surface roughening. These quantities are correlated with the shape and size of the opening in the first silicon oxynitride layer formed in step 130 where the material has to be deposited in step 150 and 160. One objective in step 150 is to find the optimal thickness for the stress relaxation with the lowest density of point defects with a smooth surface. A Ge layer thickness in the 30 to 70 nm range is typical AFM/SEM measurement, a $\mu$-Raman measurement, and an XTEM measurement are performed in order to investigate the morphological and structural properties of the Ge deposited film. Measurements are conducted on window openings of the silicon oxynitride windows formed in step 130 which have a size and shape suitable for an optoelectronics application. In larger windows which can be used for metrology purposes, the growth selectivity is also investigated using a process such as spatially resolved SIMS—Secondary Ion Mass Spectroscopy. Devices are designed to test the compatibility of this process step with the entire production flow.

At step 160, there is a high temperature deposition of a Ge (HTGE—high temperature Ge) active layer, which serves as the core of an active region. After the heterostructure stress relaxation in step 150, the Ge growth proceeds in a quasi-homoepitaxial manner. The high temperature of the deposition promotes the growth in a layer-by-layer mode, leading to both a desirable crystal quality and a smooth film surface. The higher temperature also changes the surface reaction, allowing an increased growth rate. Typical values for this step are deposition temperatures between 600–700° C. and a growth rate of 10–20 nm/min. The deposited film thickness is dependent on the device design: 300 nm can be a guidelines. This design takes into account the upper limit of Ge thickness due to the layer thickness of the dielectric stack subsequently deposited, and the length of the contacts that penetrate the dielectric layer immediately placed over the germanium. The optimal combination of growth parameters (material deposited, gas flows, partial pressures, and deposition temperature) is also influenced by their impact on the film homogeneity over the substrate. The optimal growth parameters result in a quasi-fully relaxed, epitaxial, monocrystalline, smooth planar Ge active layer with a low point defect and threading dislocation density.

On the test structures/test measurements, similar to the previous step, an AFM/SEM measurement, a $\mu$-Raman measurement, and an XTEM measurement are taken. These measurements are performed on a window opening on the silicon oxynitride layer formed in step 130 which have a size and shape suitable for an optoelectronics application. In larger windows which can be used for metrology purpose, XRD in comparison with $\mu$-Raman measurement provides insight on the crystalline quality and the residual stress. Growth selectivity at this higher deposition temperature is monitored in conjunction with the material homogeneity over the wafer on a structure suitable for metrology measurements. Hall Effect measurements may yield information on carrier mobility.

At step 170, the Ge film is implanted to fabricate the type of device that is desired. In this step, the process 100 performs the Ge doping in order to obtain the energy band profile requested by the device design. The annealing treatment for the implant activation is performed in RTA (Rapid Thermal Annealing) conditions: typical substrate temperature in the step will be in the 450–600° C. range. The step 170 of implantation can be repeated with different doses, energies, and species if needed in the final device design.

As for test structures/test measurements: SIMS and spreading resistance measurements are used to study the dopant spatial distribution and their electrical activity in the high temperature Ge active layer. In order to test the impact of this step on the process flow integrated test-devices will be fabricated: dopant diffusion, and Ge—Ge leakage current being the main concerns.

In step 180, the process 100 deposits a second silicon oxynitride layer for Ge surface passivation. The deposition of a second silicon oxynitride layer is completed in this step. The second silicon oxynitride layer is a suitable material for Ge surface passivation. This same silicon oxynitride layer, or an additional one with the same of different composition, layer may also be used to stop the via etch on top of the Ge layer.

Steps 161, 162, and 163 are optional steps for an alternative process. At step 161, the surface quality can be improved by depositing Antimony (Sb) during the growth. The surfactant action of this element reduces the roughening/islanding phenomenon similar to Hydrogen. The use of Sb as a surfactant allows the deposition of a thinner Ge buffer layer in step 150, and increases the average growth rate of the process as the deposition temperature can be kept higher. This process step operates as an alternate solution to the deposition of the high temperature Ge active layer in step 160. The test structures/test measurements are the same as those requested in step 160. A cautionary measure is taken in the event that unintentional n-doping is generated from the Sb.

Step 162 quenches the defects in the Ge films. Threading dislocations are common defects in Ge films grown by using this technique, and their density depends on the quality of the Ge/Si heterointerface. Quenching is performed by means of a post-annealing process wherein the substrate temperature is modulated between a low temperature and a high temperature for an optimal number of cycles. Typical values are 700° and 900° C. as minimum and maximum temperature values in a 10 cycle repetition. A forming (inert) gas can be used to prevent surface contamination during the treatment. It is noted that such a high temperature process can enhance GeSi intermixing at the interface. This intermixing actually helps the stress relaxation, offering an alternate way to perform strain reduction (strain buffering). The shape of the active window is designed to promote dislocation mobility and quenching. This process has been demonstrated to be effective on Ge layer deposited on bare (non-patterned) Si substrate.

On test structures/test measurements, the film is investigated by both XTEM-TEM (Transmission Electron Microscopy) and etch pit counting in order to obtain the threading dislocation density. SIMS characterization of the interface is needed in order to investigate the extent of the Ge—Si intermixing. The compatibility of this process step (dopant diffusion) with the whole flow is tested by means of suitable devices.

At step 163, an epi-smooth process is performed on the high temperature Ge active layer deposited in step 160. The strain relaxation process in the high temperature Ge active layer can, depending on the kinetics, induce surface roughening (for example, RMS roughness of the order of 10 nm). The surface planarity requested by the subsequent process flow can be recovered by means of an epi-smoothing process. In this step, the surface of the high temperature active Ge active layer is exposed to a gas mixture made of germane, hydrogen, and hydrogen chloride at a surface temperature in the 600–700° C. range. The ridges of the rough surface are smoothed by this process because the etch rate is dependent on the local strain conditions of the surface. On test structures/test measurements, this process step is performed immediately after the high temperature Ge active deposition and the test structure/measurement is the same as in step 160. The objective of this optimization process is to obtain a smoother surface that can meet the specification of the subsequent process in the standard CMOS flow: a roughness RMS of 1 nm or less can be considered typical.

At step 190, a dielectric stack is deposited over the second oxynitride layer formed in step 180. The process 100 then returns to the standard CMOS process flow 195.

Figure 2:
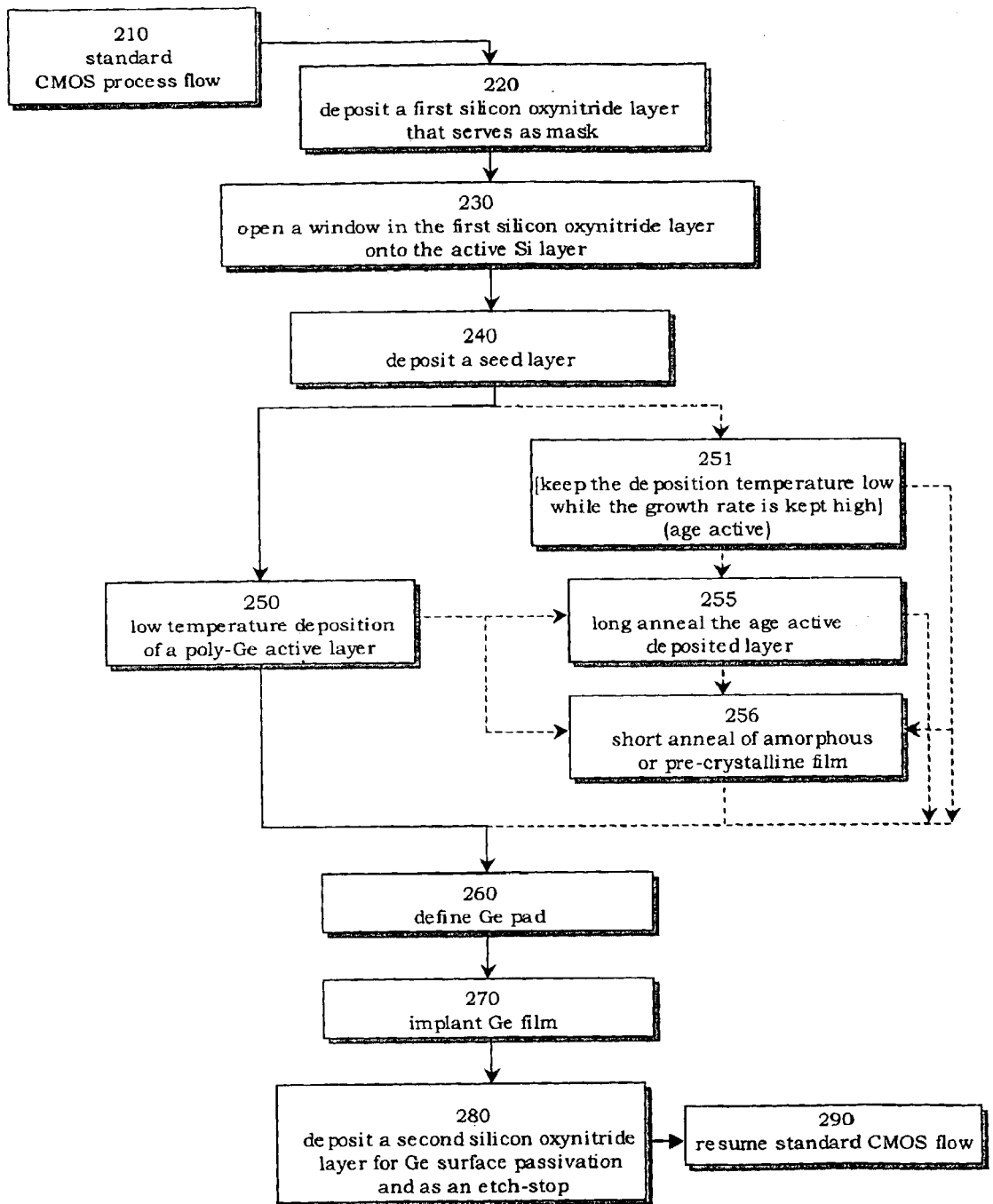
FIG. 2 depicts a flow diagram illustrating a second embodiment of the process for poly-Ge growth on silicon in accordance with the present invention.

In FIG. 2, therein is shown a flow diagram illustrating a second embodiment of a process for poly-Ge growth. At step 210, the manufacturing of a chip employs a standard CMOS flow with a silicon substrate using a silicon-on-insulator process. The process 200 continues until the salicide annealing. In step 220, the process 200 deposits a first silicon oxynitride layer. This oxynitride layer is then patterned in order to expose areas of the underlying Si substrate in the process step 230.

At step 230, the process 200 opens a window in the first silicon oxynitride layer onto the active silicon layer. This step defines the opening to the active Si substrate. The substrate can be n-doped. The active window shape created in step 230 is optimized considering photonic design requirements. A standard, ex-situ wet etching/cleaning step is performed prior to sample loading in the reactor where the subsequent process step will take place. An in-situ high-temperature step is optional.

The process 200 deposits a seed layer in step 240, made of either Ge or Si. The saturation of the Si bonds by contaminants (native oxide etc.) leads to a poor sticking of the germane molecules to the surface. To remedy this, a first Ge layer can be deposited, exploiting the physisorption mechanism to act as a seed layer for the subsequent growth. One way to obtain physiororption in a typical CVD process reactor, is, for example, the following: the molecules containing the atom are cracked and deposited (e.g. germane molecule to obtain germanium) by temperature pulsing or hot wire catalysis, away from the substrate surface. Depending on the kinetics/thermodynamics condition of the seed layer deposition, the resulting Ge layer is either poly-crystalline or amorphous. An in-situ-deposited poly-Si layer could also play the role of seed for the subsequent growth by providing high density of dangling bonds.

In step 250 the process 200 deposits a poly-crystalline germanium active layer on the seed deposited in step 240. Once the seed layer has been deposited, the size of the poly-crystallite is optimized by tuning the growth rate and the deposition temperature: 350–500° C. are typical values for this step. The size of the poly-crystallite is related to the strain energy stored in the grain itself and, thus, to its optical properties. The influence of the film thickness on the grain size and shape is optimized in order to increase the device collection length. The poly-Ge layer thickness is also dependent on the device design. The deposition parameters also influence the H:Ge bonds at the grain boundaries, i.e. the is surface electronic states, and thus the electrical properties of the film. The eventual poly-Ge layer thickness is dependent on the device design. Therefore, the film morphology and structure, such as the grain size and orientation, affect the material electrical properties which need to be considered to optimize a device design.

On test structures/test measurements, AFM/SEM measurement, $\mu$-Raman measurement, and XTEM measurement provide insights on surface morphology, crystalline quality, and residual strain status. Metrology measurements provides information on growth rate and material homogeneity. These measurements are performed on and off the window openings in step 230, i.e. on the film deposited on the Si substrate or on the silicon oxynitride mask respectively.

At step 260, the poly-crystalline growth is not selective and a Ge-pad definition step is typically added. A Chlorine-based (Cl-based) etch can be used in order to remove the Ge deposited outside the openings of windows in the first silicon oxynitride layer. Alternatively, an in-situ etch using an HCl-hydrogen mixture could be used. Metrology and surface analysis measurement is used to confirm a complete removal of unwanted material. If poly-Si has been used as the seed layer, it will be removed by this process step.

As for test structures/test measurements, material homogeneity is monitored on a structure suitable for metrology measurements both over the wafer and on a window opening site formed in step 230. Hall Effect measurements provide insight on carrier mobility and on the electrical properties of the deposited film. A spreading resistance test is also useful.

At step 270, Ge is doped or implanted in order to obtain the energy band profile requested by the device design (dopant compensation). A post annealing treatment is performed in RTA conditions at a substrate temperature in the 450–600° C. range. On test structures/test measurements, SIMS, and spreading resistance measurements are used to study the dopant spatial distribution and their electrical activity in the Ge pad layer. A suitable device is designed for testing the impact of this step on the process flow (dopant diffusion, Ge—Ge leakage are examples).

At step 280, the process 200 deposits a second silicon oxynitride layer for Ge surface passivation. The silicon oxynitride is a suitable material for Ge surface passivation. The silicon oxynitride layer is also needed to stop the via etch on top of the Ge layer. At step 290, the process 200 returns to standard CMOS process flow.

Steps 251, 255, and 256 are optional steps in an alternate process. At step 251, a low temperature variation of the technique described in step 250 is performed, referred to hereinafter as "age active". After the deposition of a Ge or Si seed layer, the deposition temperature is kept as low as 300° C., while growth rate can be kept high by modifying the growth parameters. The deposition results in an amorphous Ge layer with high H content. Regarding test structures/test measurements, the same procedures are used as those in step 250.

At step 255, long anneal (for example, a few hours) and low-temperature (300–350° C.) treatments are performed on the amorphous germanium active deposited layer in a controlled atmosphere. This treatment releases the hydrogen stored in the material is during the growth performed in steps 250 and 251, and it provides short range ordering in the amorphous film formed in step 251, leading to the formation of poly-crystallite sites that acts as centers for re-crystallization in step 255.

At step 256, a short annealing (for example, can be RTA or pulsed) is performed on the amorphous or poly-crystalline film obtained in steps 250, 251, and 255. This annealing is done at a high temperature (450–550° C.) and in a controlled atmosphere (for example, gas mixture composition). This treatment results in the formation of large Ge poly-crystalline grains. Regarding test structures/test measurements, the same procedures are used as those in step 250.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. A method for incorporating one or more germanium layers in a standard CMOS flow, comprising:

providing a silicon-based substrate using a standard CMOS process;

depositing a first silicon oxynitride ($Si_xO_yN_z$, herein after referred to SON) layer overlying the silicon-based substrate that serves as a mask;

etching the first SON layer onto the silicon-based substrate to form a trench in the SON, thereby forming a SON patterned substrate as defined by a first region of the SON spaced apart laterally from a second region of the SON and above the silicon-based substrate; and depositing a first germanium layer into a portion of the trench that is incorporated as part of a CMOS process, the trench being formed by the first region of SON, the silicon-based substrate, and the second region of SON.

2. The method of claim 1, wherein the deposition of the first germanium layer is conducted at a low temperature.

3. The method of claim 2, wherein the first germanium layer is deposited at the low temperature comprises a thin germanium layer.

4. The method of claim 3, further comprising depositing a second germanium layer into the trench over the first germanium layer at the low temperature.

5. The method of claim 4, wherein the second germanium layer comprises a thick germanium layer overlaying the first thin germanium layer at the low temperature.

6. The method of claim 4, wherein the second germanium layer serves as an active layer or a dummy layer.

7. The method of claim 4, wherein the deposition of the second germanium layer is conducted at a high temperature.

8. The method of claim 4, wherein the deposition of the second thick germanium layer is conducted at a high temperature.

9. The method of claim 7, further comprising implanting the second Ge layer with dopant ions.

10. The method of claim 9, further comprising quenching one or more defects in the first germanium layer, the second germanium layer, or the first and second germanium layers.

11. The method of claim 10, further comprising depositing a second SON layer overlaying the second germanium layer for germanium surface passivation.

12. The method of claim 11, further comprising depositing a dielectric stack overlaying the second SON layer.

13. The method of claim 7, further comprising depositing a dielectric stack overlaying the second SON layer.

14. The method of claim 10, further comprising reducing a surface roughness of the second germanium layer by means of an epi-smoothing process.

15. The method of claim 14, further comprising depositing a second SON layer overlaying the second germanium layer for germanium surface passivation.

16. The method of claim 15, further comprising depositing a dielectric stack overlaying the second SON layer.

17. The method of claim 7, further comprising quenching one or more defects in the first germanium layer, the second germanium layer, or the first and second germanium layers.

18. The method of claim 17, further comprising depositing a second SON layer overlaying the second germanium layer for germanium surface passivation.

19. The method of claim 18, further comprising depositing a dielectric stack overlaying the second SON layer.

20. The method of claim 17, further comprising reducing a surface roughness on the second germanium layer by means of an epi-smoothing process.

21. The method of claim 20, further comprising a second SON layer overlaying the second germanium layer used for germanium surface passivation.

22. The method of claim 21, further comprising depositing a dielectric stack overlaying the second SON layer.

23. The method of claim 7, further comprising reducing a surface roughness on the second germanium layer by means of an epi-smoothing process.

24. The method of claim 23, further comprising a second SON layer overlaying the second germanium layer that is also used for germanium surface passivation.

25. The method of claim 24, further comprising depositing a dielectric stack overlaying the second SON layer.

26. The method of claim 23, further comprising quenching one or more defects in the first germanium layer, the second germanium layer, or the first and second germanium layers.

27. The method of claim 26, further comprising a second SON layer overlaying the second germanium layer that is also used for germanium surface passivation.

28. The method of claim 7, wherein a second SON layer overlaying the second germanium layer is also used for germanium surface passivation.

29. The method of claim 28, further comprising depositing a dielectric stack overlaying the second SON layer.

30. The method of claim 4, further comprising depositing Antimony (Sb) during the growth of the second germanium active layer.

31. The method of claim 30, further comprising implanting the second Ge layer with dopant ions.

32. The method of claim 31, further comprising quenching one or more defects in the first germanium layer, the second germanium layer, or the first and second germanium layers.

33. The method of claim 32, further comprising depositing a second SON layer overlaying the second germanium layer for germanium surface passivation.

34. The method of claim 33, further comprising depositing a dielectric stack overlaying the second SON layer.

35. The method of claim 7, further comprising depositing a dielectric stack overlaying the second SON layer.

36. The method of claim 32, further comprising reducing a surface roughness on the second germanium layer by means of an epi-smoothing process.

37. The method of claim 36, further comprising depositing a second SON layer overlaying the second germanium layer for germanium surface passivation.

38. The method of claim 37, further comprising depositing a dielectric stack overlaying the second SON layer.

39. The method of claim 30, further comprising quenching one or more defects in the first germanium layer, the second germanium layer, or the first and second germanium layers.

40. The method of claim 39, further comprising depositing a second SON layer overlaying the second germanium layer for germanium surface passivation.

41. The method of claim 40, further comprising depositing a dielectric stack overlaying the second SON layer.

42. The method of claim 39, further comprising reducing a surface roughness of the second germanium layer by means of an epi-smoothing process.

43. The method of claim 42, further comprising a second SON layer overlaying the second germanium layer used for germanium surface passivation.

44. The method of claim 43, further comprising depositing a dielectric stack overlaying the second SON layer.

45. The method of claim 30, further comprising reducing a surface roughness on the second germanium layer by means of an epi-smoothing process.

46. The method of claim 45, further comprising a second SON layer overlaying the second germanium layer that is also used for germanium surface passivation.

47. The method of claim 46, further comprising depositing a dielectric stack overlaying the second SON layer.

48. The method of claim 45, further comprising quenching one or more defects in the first germanium layer, the second germanium layer, or the first and second germanium layers.

49. The method of claim 48, further comprising a second SON layer overlaying the second germanium layer that is also used for germanium surface passivation.

50. The method of claim 30, wherein the second SON layer overlaying the second germanium layer is also used for germanium surface passivation.

51. The method of claim 50, further comprising depositing a dielectric stack overlaying the second SON layer.

52. The method of claim 5, further comprising implanting the second Ge layer with dopant ions.

53. The method of claim 52, further comprising quenching one or more defects in the first germanium layer, the second germanium layer, or the first and second germanium layers.

54. The method of claim 53, further comprising depositing a second SON layer overlaying the second germanium layer for germanium surface passivation.

55. The method of claim 54, further comprising depositing a dielectric stack overlaying the second SON layer.

56. The method of claim 5, further comprising depositing a dielectric stack overlaying the second SON layer.

57. The method of claim 53, further comprising reducing a surface roughness on the second germanium layer by means of an epi-smoothing process.

58. The method of claim 57, further comprising depositing a second SON layer overlaying the second germanium layer for germanium surface passivation.

59. The method of claim 58, further comprising depositing a dielectric stack overlaying the second SON layer.

60. The method of claim 5, further comprising quenching one or more defects in the first germanium layer, the second germanium layer, or the first and second germanium layers.

61. The method of claim 60, further comprising depositing a second SON layer overlaying the second germanium layer for germanium surface passivation.

62. The method of claim 61, further comprising depositing a dielectric stack overlaying the second SON layer.

63. The method of claim 60, further comprising reducing a surface roughness on the second germanium layer by means of an epi-smoothing process.

64. The method of claim 63, further comprising a second SON layer overlaying the second germanium layer used for germanium surface passivation.

65. The method of claim 64, further comprising depositing a dielectric stack overlaying the second SON layer.

66. The method of claim 5, further comprising reducing a surface roughness on the second germanium layer by means of an epi-smoothing process.

67. The method of claim 66, further comprising a second SON layer overlaying the second germanium layer that is also used for germanium surface passivation.

68. The method of claim 67, further comprising depositing a dielectric stack overlaying the second SON layer.

69. The method of claim 66, further comprising quenching one or more defects in the first germanium layer, the second germanium layer, or the first and second germanium layers.

70. The method of claim 69, further comprising a second SON layer overlaying the second germanium layer that is also used for germanium surface passivation.

71. The method of claim 5, wherein the second SON layer overlaying the second germanium layer is also used for germanium surface passivation.

72. The method of claim 71, further comprising depositing a dielectric stack overlaying the second SON layer.

73. The method of claim 1, further comprising performing an epi-clean procedure on the SON patterned substrate.

74. The method of claim 73, wherein the deposition of the first germanium layer is conducted at a low temperature.

75. The method of claim 74, wherein the first germanium layer at the low temperature comprises a thin germanium layer.

76. The method of claim 75, further comprising depositing a second germanium layer into the trench over the first germanium layer at the low temperature.

77. The method of claim 76, wherein the second germanium layer comprises a thick germanium layer overlaying the first thin germanium layer at the low temperature.

78. The method of claim 76, wherein the second germanium layer serves as an active layer or a dummy layer.

79. The method of claim 76, wherein the deposition of the second germanium layer is conducted at a high temperature.

80. The method of claim 76, wherein the deposition of the second thick germanium layer is conducted at a high temperature.

81. The method of claim 79, further comprising implanting the second germanium layer with dopant ions.

82. The method of claim 81, further comprising quenching one or more defects in the first germanium layer, the second germanium layer, or the first and second germanium layers.

83. The method of claim 82, further comprising depositing a second SON layer overlaying the second germanium layer for germanium surface passivation.

84. The method of claim 83, further comprising depositing a dielectric stack overlaying the second SON layer.

85. The method of claim 79, further comprising depositing a dielectric stack overlaying the second SON layer.

86. The method of claim 85, further comprising reducing a surface roughness on the second germanium layer by means of an epi-smoothing process.

87. The method of claim 82, further comprising depositing a second SON layer overlaying the second germanium layer for germanium surface passivation.

88. The method of claim 87, further comprising depositing a dielectric stack overlaying the second SON layer.

89. The method of claim 79, further comprising quenching one or more defects in the first germanium layer, the second germanium layer, or the first and second germanium layers.

90. The method of claim 89, further comprising depositing a second SON layer overlaying the second germanium layer for germanium surface passivation.

91. The method of claim 90, further comprising depositing a dielectric stack overlaying the second SON layer.

92. The method of claim 89, further comprising reducing a surface roughness on the second germanium layer by means of an epi-smoothing process.

93. The method of claim 92, further comprising a second SON layer overlaying the second germanium layer used for germanium surface passivation.

94. The method of claim 21, further comprising depositing a dielectric stack overlaying the second SON layer.

95. The method of claim 79, further comprising reducing a surface roughness on the second germanium layer by means of an epi-smoothing process.

96. The method of claim 95, further comprising a second SON layer overlaying the second germanium layer that is also used for germanium surface passivation.

97. The method of claim 96, further comprising depositing a dielectric stack overlaying the second SON layer.

98. The method of claim 95, further comprising quenching one or more defects in the first germanium layer, the second germanium layer, or the first and second germanium layers.

99. The method of claim 98, further comprising a second SON layer overlaying the second germanium layer that is also used for germanium surface passivation.

100. The method of claim 79, wherein the second SON layer overlaying the second germanium layer is also used for germanium surface passivation.

101. The method of claim 100, further comprising depositing a dielectric stack overlaying the second SON layer.

102. The method of claim 76, further comprising depositing Antimony during the growth of the second germanium active layer.

103. The method of claim 102, further comprising implanting the second germanium layer with dopant ions.

104. The method of claim 103, further comprising quenching one or more defects in the first germanium layer, the second germanium layer, or the first and second germanium layers.

105. The method of claim 104, further comprising depositing a second SON layer overlaying the second germanium layer for germanium surface passivation.

106. The method of claim 105, further comprising depositing a dielectric stack overlaying the second SON layer.

107. The method of claim 102, further comprising depositing a dielectric stack overlaying the second SON layer.

108. The method of claim 104, further comprising reducing a surface roughness on the second germanium layer by means of an epi-smoothing process.

109. The method of claim 108, further comprising depositing a second SON layer overlaying the second germanium layer for germanium surface passivation.

110. The method of claim 109, further comprising depositing a dielectric stack overlaying the second SON layer.

111. The method of claim 102, further comprising quenching one or more defects in the first germanium layer, the second germanium layer, or the first and second germanium layers.

112. The method of claim 111, further comprising depositing a second SON layer overlaying the second germanium layer for germanium surface passivation.

113. The method of claim 112, further comprising depositing a dielectric stack overlaying the second SON layer.

114. The method of claim 112, further comprising reducing a surface roughness on the second germanium layer by means of an epi-smoothing process.

115. The method of claim 114, further comprising a second SON layer overlaying the second germanium layer used for germanium surface passivation.

116. The method of claim 115, further comprising depositing a dielectric stack overlaying the second SON layer.

117. The method of claim 102, further comprising reducing a surface roughness on the second germanium layer by means of an epi-smoothing process.

118. The method of claim 117, further comprising a second SON layer overlaying the second germanium layer that is also used for germanium surface passivation.

119. The method of claim 118, further comprising depositing a dielectric stack overlaying the second SON layer.

120. The method of claim 117, further comprising quenching one or more defects in the first germanium layer, the second germanium layer, or the first and second germanium layers.

121. The method of claim 120, further comprising a second SON layer overlaying the second germanium layer that is also used for germanium surface passivation.

122. The method of claim 102, wherein the second SON layer overlaying the second germanium layer is also used for germanium surface passivation.

123. The method of claim 122, further comprising depositing a dielectric stack overlaying the second SON layer.

124. The method of claim 77, further comprising implanting the second Ge layer with dopant ions.

125. The method of claim 124, further comprising quenching one or more defects in the first germanium layer, the second germanium layer, or the first and second germanium layers.

126. The method of claim 125, further comprising depositing a second SON layer overlaying the second germanium layer for germanium surface passivation.

127. The method of claim 126, further comprising depositing a dielectric stack overlaying the second SON layer.

128. The method of claim 77, further comprising depositing a dielectric stack overlaying the second SON layer.

129. The method of claim 125, further comprising reducing a surface roughness on the second germanium layer by means of an epi-smoothing process.

130. The method of claim 129, further comprising depositing a second SON layer overlaying the second germanium layer for germanium surface passivation.

131. The method of claim 130, further comprising depositing a dielectric stack overlaying the second SON layer.

132. The method of claim 77, further comprising quenching one or more defects in the first germanium layer, the second germanium layer, or the first and second germanium layers.

133. The method of claim 132, further comprising depositing a second SON layer overlaying the second germanium layer for germanium surface passivation.

134. The method of claim 133, further comprising depositing a dielectric stack overlaying the second SON layer.

135. The method of claim 132, further comprising reducing a surface roughness on the second germanium layer by means of an epi-smoothing process.

136. The method of claim 135, further comprising a second SON layer overlaying the second germanium layer used for germanium surface passivation.

137. The method of claim 136, further comprising depositing a dielectric stack overlaying the second SON layer.

138. The method of claim 77, further comprising reducing a surface roughness on the second germanium layer by means of an epi-smoothing process.

139. The method of claim 138, further comprising a second SON layer overlaying the second germanium layer that is also used for germanium surface passivation.

140. The method of claim 139, further comprising depositing a dielectric stack overlaying the second SON layer.

141. The method of claim 138, further comprising quenching one or more defects in the first germanium layer, the second germanium layer, or the first and second germanium layers.

142. The method of claim 141, further comprising a second SON layer overlaying the second germanium layer that is also used for germanium surface passivation.

143. The method of claim 77, wherein the second SON layer overlaying the second germanium layer is also used for germanium surface passivation.

144. The method of claim 143, further comprising depositing a dielectric stack overlaying the second SON layer.

145. The method of claim 1, further comprising depositing a seed layer into a portion of the trench formed by the first region of the SON, the silicon-based substrate, and the second region of the SON.

146. The method of claim 145, wherein the seed layer comprises a silicon layer.

147. The method of claim 145, wherein the seed layer comprises an amorphous layer.

148. The method of claim 145, wherein the seed layer comprises a poly-crystalline layer.

149. The method of claim 145, wherein the seed layer comprises a germanium amorphous layer.

150. The method of claim 145, wherein the seed layer comprises a germanium poly-crystalline layer.

151. The method of claim 145, wherein the deposition of the seed layer is conducted at a low temperature.

152. The method of claim 151, further comprising performing a lithography on the first germanium layer and the silicon amorphous layer thereby creating a germanium pad. (let's discuss).

153. The method of claim 152, further comprising depositing a second germanium layer into the trench over the first germanium layer.

154. The method of claim 151, further comprising depositing a second germanium layer into the trench over the first germanium layer.

155. The method of claim 154, further comprising performing a lithography on the first and second germanium layers thereby creating a germanium pad.

156. The method of claim 154, further comprising implanting the second germanium layer with dopant ions.

157. The method of claim 156, further comprising annealing the germanium file by modulating a film temperature between a low temperature and a high temperature for a plurality of cycles, the size and orientation of the germanium film allowing a lower low temperature in the low temperature than a typical low temperature and a lower high temperature in the high temperature than a typical high temperature.

158. The method of claim 157, further comprising reducing a surface roughness on the second germanium layer by means of an epi-smoothing process.

159. The method of claim 154, further comprising depositing Antimony during the growth of the second germanium active layer.

160. The method of claim 159, further comprising reducing a surface roughness on the second germanium layer by means of an epi-smoothing process.

161. The method of claim 159, further comprising annealing the germanium film by modulating film temperature between a low temperature and a high temperature for a plurality of cycles, the size and orientation of the germanium film allowing a lower low temperature in the low temperature than a typical low temperature and a lower high temperature in the high temperature than a typical high temperature.

162. The method of claim 161, further comprising reducing a surface roughness by means of an epi-smoothing process.

163. The method of claim 159, further comprising implanting the second germanium layer with dopant ions.

164. The method of claim 163, further comprising annealing the germanium file by modulating a film temperature between a low temperature and a high temperature for a plurality of cycles, the size and orientation of the germanium film allowing a lower low temperature in the low temperature than a typical low temperature and a lower high temperature in the high temperature than a typical high temperature.

165. The method of claim 164, further comprising reducing a surface roughness on the second germanium layer by means of an epi-smoothing process.

166. The method of claim 1, between the providing step and the depositing step of the first silicon oxynitride, further comprising depositing one or more additional silicon oxynitride layers between the silicon-based substrate and the first silicon oxynitride.

167. The method of claim 166, wherein the first silicon oxynitride is selected of a different chemical composition from the one or more additional silicon oxynitride layers.

168. The method of claim 166, wherein the one or more additional silicon oxynitride layers are selected of a different chemical composition between themselves.

169. The method of claim 1, wherein the parameters of y or z in the $Si_xO_yN_z$ is zero.

170. The method of claim 166, wherein the parameters of y or z in the $Si_xO_yN_z$ is zero.

171. The method of claim 1, wherein the silicon-based substrate comprises a silicon-on-insulator (SOI) substrate.

172. The method of claim 1, wherein the silicon-based substrate comprises a silicon-on-sapphire (SOS) substrate.

173. The method of claim 1, wherein the silicon-based substrate comprises a silicon germanium layer.

\* \* \* \* \*